United States Patent [19]

Tokami et al.

[11] Patent Number: 5,285,416
[45] Date of Patent: Feb. 8, 1994

[54] SEMICONDUCTOR MEMORY DEVICE WITH RESTRICTED POTENTIAL AMPLITUDE OF DATA LINES AND OPERATION METHOD THEREOF

[75] Inventors: Kenji Tokami; Takahiro Komatsu, both of Hyogo, Japan

[73] Assignee: Mitsubishi Denki Kabushiki Kaisha, Tokyo, Japan

[21] Appl. No.: 916,427

[22] Filed: Jul. 21, 1992

[30] Foreign Application Priority Data

Jul. 23, 1991 [JP] Japan ................. 3-182301

[51] Int. Cl.⁵ .................................... G11C 7/00
[52] U.S. Cl. .................... 365/190; 365/203; 365/207; 365/208
[58] Field of Search ............... 365/190, 203, 207, 208, 365/222, 202

[56] References Cited

U.S. PATENT DOCUMENTS 5,115,412  5/1992  Tobita ........................... 365/190
5,124,947  6/1992  Nakada ......................... 365/210

OTHER PUBLICATIONS

Session XVI: Static RAMs THPM 1.62: A 30ns 256K Full CMOS SRAM, Okazaki et al., 1986 IEEE International Solid-State Circuits Conference, pp. 204-205.

*Primary Examiner*—Eugene R. LaRoche
*Assistant Examiner*—Andrew Tran
*Attorney, Agent, or Firm*—Lowe, Price, LeBlanc & Becker

[57] ABSTRACT

In a DRAM having two I/O lines commonly provided for reading and writing data and an amplifying circuit for providing a read data signal by amplifying potential difference between the two I/O lines, a potential difference control circuit 8 is provided which includes detecting circuits each having a parallel connected circuit of two MOS transistors each being diode-connected, and a switch circuit which is rendered conductive only at data reading.

Since the maximum value of the potential difference between the two I/O lines during data reading is controlled to several times that of the threshold voltage of a MOS transistor, the time necessary for equalizing the I/O lines at data reading can be reduced. Consequently, the speed of change of the output potential of the amplifying circuit changing to the potential corresponding to the data stored in the memory cell MC is increased, and therefore the access time is reduced.

20 Claims, 11 Drawing Sheets

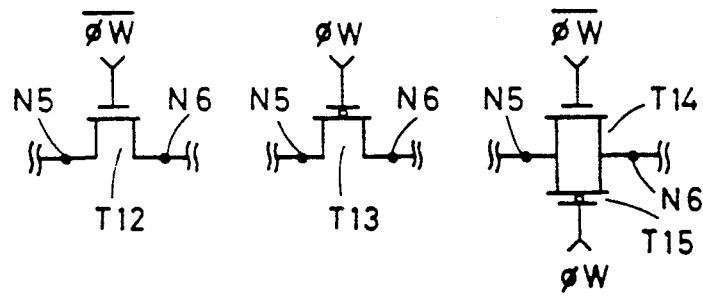
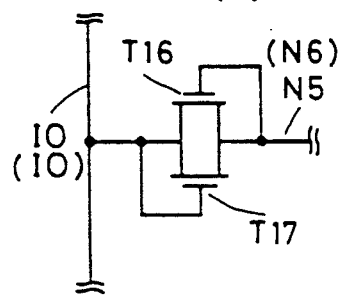 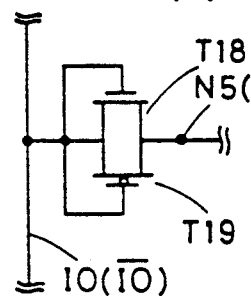 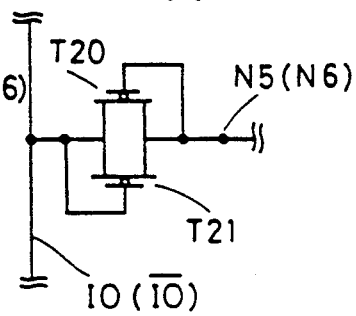
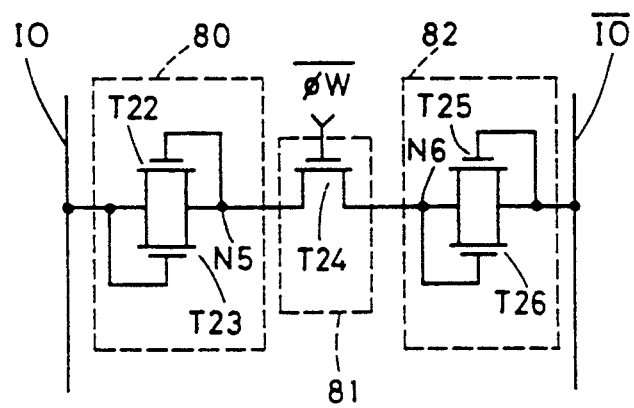

SEMICONDUCTOR MEMORY DEVICE WITH RESTRICTED POTENTIAL AMPLITUDE OF DATA LINES AND OPERATION METHOD THEREOF

BACKGROUND OF THE INVENTION

1. Field of the Invention

The present invention relates to a semiconductor memory device and operation method thereof and, more specifically, to a semiconductor memory device and operation method thereof in which data stored in a memory cell is read by utilizing potential difference between two bit lines.

2. Description of the Background Art

Generally, in a semiconductor memory device such as a DRAM (Dynamic Random Access Memory) or an SRAM (Static Random Access Memory), memory cells are arranged in a plurality of rows and columns, and two bit lines are provided corresponding to each column of the memory cells.

In data reading, potential of one of the two bit lines corresponding to the column including the memory cell from which data is to be written rises, and potential of the other one lowers. Potential of which one of the two bit line rises (or lowers) depends on the data stored in the memory cell. Therefore, a signal provided by amplifying the potential difference between these two bit lines is regarded as the data stored in the memory cell.

FIG. 10 is a schematic block diagram showing the whole structure of a conventional DRAM. A general structure and operation of the conventional DRAM will be described with reference to FIG. 10.

In the following description in this specification, a low-active signal is represented by a reference character with "/", and a signal line transmitting the low-active signal is represented by a reference character with "/".

A memory cell array 61 includes memory cells MCs arranged in a plurality of rows and columns, a plurality of word lines WL provided corresponding to the plurality of rows, and two bit lines BL and /BL provided corresponding to each of the plurality of columns. All bit line pairs BL and /BL are connected to a sense amplifier group 60 and a bit line equalizer 59.

The operation of the DRAM when data is read from memory cell array 61 is as follows.

When data is read from memory cell array 61 address buffer 54 takes and buffers external address signals A0–An and applies column address signals CA0–CA(n−1) designating one of the memory cell columns in memory cell array 61, row address signals RA0–RA(n−1) designating one of the memory cell rows of the memory cell array 61, and a signal An of the most significant bit of the external address signals A0–An to column decoder 57, row decoder 58 and I/O control circuit 53, respectively.

Each word line WL is commonly connected to all memory cells MCs arranged in the corresponding row, and each bit line BL, /BL is commonly and alternately connected to the memory cells MCs arranged in the corresponding column.

Row decoder 58 decodes row address signals RA0–RA(n−1) from address buffer 65, and activates to a high level one word line provided corresponding to the row of the memory cells designated by the row address signal out of the word lines WL in memory cell array 61. Consequently, it becomes possible to exchange data signal between each memory cell MC connected to the activated word line WL corresponding to the row address signal and the bit line BL or /BL connected to the memory cell MC. The potential of the bit line BL or /BL connected to the memory cell MC changes dependent on the data stored in each memory cell MC connected to the one word line WL.

Sense amplifier group 60 includes a plurality of sense amplifiers (not shown) provided corresponding to all bit line pairs BL, /BL in memory cell array 61. Each sense amplifier amplifies potential difference between two bit lines BL and /BL constituting the corresponding bit line pair BL, /BL.

I/O gate·I/O line 62 includes a pair of I/O lines transmitting signals of complementary potential levels, and an I/O gate constituted by a plurality of transfer gates provided between the I/O line pair and the respective sense amplifiers in sense amplifier group 60.

Column decoder 67 decodes column address signals CA0–CA(n−1) from address buffer 54 and outputs a signal for controlling the transfer gate such that only the sense amplifier connected to one pair provided corresponding to the column of the memory cells designated by the column address signal out of the bit line pairs BL, /BL in memory cell array 61 is electrically connected to the I/O line pair.

An I/O line potential control circuit 5 amplifies potential difference between two I/O lines constituting the I/O line pair and applies it to data output buffer 56.

Data output buffer 56 amplifies an output signal from I/O line potential control circuit 5 and externally outputs the resulting signal as read data from memory cell array 61.

The operation of writing data to memory cell array 61 will be described.

Address buffer 54, column decoder 57, row decoder 58 and I/O gate·I/O line 62 operate in the same manner as in data reading from memory cell array 61.

A data input buffer 55 amplifies an externally input data signal and applies the same to I/O line potential control circuit 5.

I/O line potential control circuit 5 amplifies an output signal from data input buffer 55 and applies complementary potentials to the two I/O lines constituting an I/O line pair.

These two I/O lines are connected electrically to only one sense amplifier provided corresponding to the pair corresponding to one column of the memory cells designated by column address signals CA0–CA(n−1) out of the bit line pairs BL, /BL in memory cell array 61. Therefore, the complementary potentials on the two I/O lines are transmitted to the two bit lines BL and /BL provided corresponding to one column of memory cells designated by column address signals CA0–CA(n−1) through one sense amplifier.

In memory cell array 61, only one word line WL provided corresponding to one row of memory cells designated by row address signals RA0–RA(n−1) has been activated. Therefore, potential of either one of the two I/O lines is supplied to one bit line BL or /BL connected to one (selected) memory cell MC which is arranged at an intersection of one column designated by column address signals CA0–CA(n−1) and one row designated by row address signals RA0–RA(n−1). Consequently, the external input data signal is written to the selected memory cell MC through the bit line BL or /BL which is connected thereto.

In the DRAM, data stored in each memory cell MC becomes extinct as time passes. In order to avoid such phenomenon, a so-called refreshing is carried out in which the same data as stored in each memory cell MC is automatically rewritten at every prescribed time period. The length of the prescribed period is shorter than the time necessary for the stored data of each memory cell to become extinct.

A refresh control circuit 51 and a refresh counter 52 are circuits provided for refreshing.

Refresh control circuit 51 instincts refresh counter 52 to output internal address signals Q0–Q(n−1) to.

Refresh counter 52 successively generates sets of address signals Q0–Q(n−1) representing respective addresses of the memory cells MCs in memory cell array 61 at every prescribed time period under control by refresh control circuit 51, when neither data writing to the memory cell MC of the address designated by external address signals A0–An nor data reading from the memory cell MC of the address designated by external address signals A0–An is carried out.

I/O control circuit 53 activates either one of data input buffer 55 or data output buffer 56 while it is receiving the signal An of the most significant bit from address buffer 54, and inactivates both data input buffer 55 and data output buffer 56 while it is not receiving the signal An of the most significant bit.

More specifically, in a period when external control signal /WE is at a low level, that is, when data is to be written to memory cell array 61, I/O control circuit 53 activates data input buffer 55. In the period when external control signal /WE is at a high level, that is, when data is to be read from memory cell array 61, I/O control circuit 53 activates data output buffer 56.

A particular circuit operation of address buffer 54 when neither data writing nor data reading to and from the memory cell MC designated by external address signals A0–An is to be carried out will be described.

Instead of external address signals A0–An, address signals Q0–Q(n−1) generated by refresh counter 52 are taken by address buffer 54. Address buffer 54 buffers the same and provides the resulting row address signals RA0–RA(n−1) and column address signals CA0–CA(n−1) to row decoder 58 and column decoder 57, respectively.

Column decoder 57, row decoder 58, sense amplifier group 60 and I/O line potential control circuit 5 carry out the same operation as in data reading from memory cell array 61 responsive to external address signals A0–An and the same operation as in data writing to memory cell array 61 responsive to external address signals A0–An, every time the output signal from address buffer 54 changes. Therefore, data stored in all memory cells MC in memory cell array 61 are successively refreshed in accordance with the addresses.

In such periods, the signal An of the most significant bit is not applied to I/O control circuit 53 from address buffer 54, and therefore data input buffer 55 and data output buffer 56 are inactive.

A bit line equalizer 59 electrically connects two bit lines BL and /BL constituting each bit line pair to equalize the potentials to an intermediate potential between high and low levels when neither data writing nor data reading based on external address signals A0–An and on address signals Q0–Q(n−1) generated by refresh counter 52 is carried out.

Similarly, in such a period, I/O line potential control circuit 5 electrically connects two I/O lines so as to make even the potentials thereof.

A clock generator 50 generates clock signals for controlling refresh control circuit 51, address buffer 54, column decoder 57, row decoder 58 and the like based on external control signals /RAS, /CAS, and /WE such that these circuits operate in the above described manner.

FIG. 11 is a partial circuit diagram showing the internal structure of the I/O gate·I/O line 62. FIG. 11 shows, as a representative, only a circuit portion provided corresponding to arbitrary two columns of memory cells in memory cell array 61.

Referring to FIG. 11, all sense amplifiers 610 are connected to a common sense amplifier driving circuit 620 in sense amplifier group 60.

Sense amplifier driving circuit 620 is controlled by a trigger signal $\phi s$ from clock generator 50 of FIG. 11 and drives all sense amplifiers 610 when data is to be written to memory cell array 61 and when data is to be read from memory cell array 61.

Each sense amplifier 610 is a differential amplifier connected to the two bit lines BL and /BL which are connected to the corresponding column of the memory cell.

I/O gate is constituted by an N channel MOS transistor T1 connected between each bit line BL and one of the two IO lines, and an N channel MOS transistor T2 connected between each bit line /BL and the other one of the I/O line /IO.

Gates of transistors T1 and T2 which are respectively connected to two bit lines BL and /BL provided corresponding to the same column of memory cells are connected to column decoder 57 of FIG. 10 through the same signal line CY. Column decoder 57 decodes column address signals CA0–CA(n−1) from address buffer 54 of FIG. 10, and sets to the high level only one of the signal lines CY which is connected to the gates of transistors T1 and T2 provided corresponding to the column of memory cells designated by the column address signals, and sets others to the low level. Consequently, only the two transistors T1 and T2 provided corresponding to the one column of the memory cells are turned ON, and two bit lines BL and /BL provided corresponding to the column of the memory cells are electrically connected to the two IO lines, that is, IO and /IO.

An I/O line equalizer 500 and an amplifying circuit 510 are included in I/O line potential control circuit 5 of FIG. 10. Two I/O lines IO and /IO are both connected to I/O line equalizer 500 and amplifier circuit 510.

FIG. 12 is a circuit diagram showing the structure of I/O line equalizer 500.

Referring to FIG. 12, I/O line equalizer 500 includes two N channel MOS transistors T3 and T4 respectively connected between power supply Vcc and two I/O lines IO and /IO, and a P channel MOS transistor T5 and N channel MOS transistor T6 connected parallel to each other between two I/O lines IO and /IO.

A control signal $/\phi_w$ output from clock generator 50 of FIG. 10 is commonly applied to the gates of transistors T3 and T4.

Control signals $\phi_{EQ}$ and $/\phi_{EQ}$ having complementary potentials output from clock generator 50 of FIG. 10 are applied to the gate of transistor T5 and to the gate of transistor T6, respectively.

FIG. 13 is a circuit diagram showing a structure of amplifying circuit 510 of FIG. 11.

Referring to FIG. 13, amplifying circuit 510 is a current mirror type amplifier including a P channel MOS transistor T7 and N channel MOS transistors T9 and T11 connected in series between power supply Vcc and the ground Vss, and a P channel MOS transistor T8 and N channel MOS transistor T10 connected in parallel to transistors T7 and T9.

Gates of transistors T7 and T8 are connected to a node of transistors T7 and T9.

Gates of transistors T9 and T10 are connected to the two I/O lines IO and /IO of FIG. 11, respectively.

A control signal $\phi_P$ output from clock generator 50 of FIG. 10 is applied to the gate of transistor T11.

When data is written to memory cell array 61, an output potential of data input buffer 55 of FIG. 10 is applied to a connected point (a node N4) between transistors T8 and T10. When data is read from memory cell array 6, a potential $\phi_{OUT}$ of this node N4 is supplied as an output from the amplifying circuit 510 to data output buffer 56 of FIG. 10.

Circuit operation for reading data from memory cell array 61 of the DRAM will be described in greater detail with reference to FIGS. 11 to 15.

FIGS. 15(a) to 15 (l) comprise a timing chart showing potential changes at some nodes in the DRAM during data reading.

For convenience of description, output signal lines of bit lines, word lines, memory cells, sense amplifiers, transistors constituting the I/O gate and of column decoder 57 shown in FIG. 11 are denoted with reference characters in parenthesis ( ).

A circuit operation for successively reading data from memory cells MC1 and MC2 of FIG. 11 will be described as an example.

First, by row decoder 58, potential of one word line WL1 out of the word lines in memory cell array 61 is raised to a high level as shown in FIG. 14(a). Consequently, dependent on the data stored in each of the memory cells connected to the one word line WL1, potentials on bit lines connected to the memory cell changes.

FIG. 14 is a schematic diagram showing the structure of sense amplifier 610 and of memory cell MC. An arbitrary one column of memory cells is shown as a representative in FIG. 14.

Referring to FIG. 14, each memory cell MC includes an N channel MOS transistor TR and a capacitor C connected in series between the corresponding bit line BL or /BL and a low potential source such as the ground. The gate of transistor TR in each memory cell MC is connected to a word line WL corresponding to the memory cell MC. In each memory cell MC, the potential at the node of transistor TR and capacitor C corresponds to the data stored in the memory cell MC. More specifically, the stored data in each memory cell MC has the logic value of "1" and "0" when the potential at the node between the transistor TR and the capacitor C included therein is at a high level and at a low level, respectively.

Therefore, when one word line WL attains to a high level, the transistor TR is turned ON in each of the memory cells MC connected to the word line WL. Therefore, the potential of the bit line BL or /BL connected to each of memory cells MC out of the memory cells connected to the word line WL which store data "1" slightly increases because of the charges supplied from the capacitor C of the corresponding memory cell MC. The potential of the bit line BL or /BL connected to each of the memory cells MC connected to the word line WL which store data "0" slightly lowers because of the charges drawn to charge capacitor C of the corresponding memory cell MC.

In this manner, if a memory cell MC stores data "1", the potential of the bit line BL or /BL connected to this memory cell MC slightly increases in response to the rise of the potential of the word line WL connected to the memory cell MC. On the contrary, if the memory cell MC stores data "0", the potential of the bit line BL or /BL connected to the memory cell MC slightly lowers in response to the rise of the potential of the word line WL connected to the memory cell MC. In the period when neither data writing nor data reading is carried out to and from the memory cell array 61, the bit lines BL and /BL provided corresponding to each column of memory cells are set to the equal potential by the bit line equalizer 59 of FIG. 10. Therefore, when data is to be read, a slight potential difference is generated between the two bit lines BL and /BL provided corresponding to each column of memory cells in response to the rise of the potential of one word line WL.

Sense amplifier 610 includes a P channel MOS transistor 310 and an N channel MOS transistor 320 having their gates connected to the bit line BL, and a P channel MOS transistor 330 and an N channel MOS transistor 340 having their gates connected to the bit line /BL.

Transistors 310 and 320 are connected in series between signal lines 350 and 360 connected to sense amplifier driving circuit 620 of FIG. 11. Similarly, transistors 330 and 340 are connected in series between these signal lines 350 and 360.

In data reading, sense amplifier driving circuit 620 supplies supply potential and the ground potential to the signal lines 350 and 360, respectively, so as to drive all sense amplifiers 610.

Referring to FIG. 14, when the potential of bit line BL slightly increases at data reading, transistor 320 becomes a shallow conductive state (with large resistance value) in sense amplifier 610. Consequently, a voltage drop occurs at the gate connecting point of transistors 330 and 340 and at node N2. In response to the voltage drop, transistor 330 is also rendered to a shallow conductive. Consequently, voltage rises at gate connecting point between transistors 310 and 320 and at node N1. Because of the rise of potential, transistor 320 is rendered deep conductive, and lowers the potential at the gate connecting point of transistors 330 and 340 and at node N2 to the ground potential supplied to the signal line 360. In response, transistor 330 is also rendered to deep conductive, and the potential of node N1 rises to the supply potential supplied to the signal line 350. The potential at node N2 of transistors 310 and 320 and the potential at node N1 of transistors 330 and 340 are the outputs from sense amplifier 610.

In this manner, the potential of bit line BL is raised to the supply potential by means of sense amplifier 610, while the potential of bit line /BL is lowered to ground potential by the sense amplifier 610. Namely, the potential difference generated between bit lines BL and /BL is enlarged by means of the sense amplifier 610 to the difference voltage between the supply potential and the ground potential.

When the potential of bit line BL lowers slightly at data reading, transistor 310 in sense amplifier 610 is rendered shallow conductive in response, thus raises the potential of the gate connecting point of transistors 330 and 340. In response, transistor 340 is also rendered shallow conductive, and the potential at the gate connection point of transistors 310 and 320 lowers. Consequently, transistors 310 and 340 are rendered deep conductive, the potential of node N1 is lowered to the ground potential, and the potential at node N2 is raised to the supply potential.

In this manner, the potential of bit line BL is decreased to the ground potential by means of the sense amplifier 610, while the potential of bit line /BL is raised to the supply potential by means of the sense amplifier 610. Namely, in this case also, the slight potential difference generated between bit lines BL and /BL is enlarged to the difference voltage between the supply potential and the ground potential.

Referring to FIG. 11, assume that the data stored in memory cell MC1 and the data stored in memory cell MC2 are "1" and "0", respectively.

In response to the rise of the potential of the word line WL1 (See FIG. 15(a)), potentials at bit lines BL1 and BL2 slightly rises and lowers, respectively, from the equalized potential, as shown in FIGS. 15(b) and (c). The potentials on bit lines /BL1 and /BL2 are maintained at the intermediate potential immediately after the rise of the potential on word line WL1, as shown in FIGS. 15(b) and (c).

Control signal $\phi_S$ attains to a high level immediately after the rise of the potential of the word line WL1 (see FIG. 15(d)). Sense amplifier driving circuit 620 drives all sense amplifiers 610 while the potential of the control signal $\phi_S$ is at the high level.

Therefore, the potentials on bit lines BL1 and /BL2 are raised to the supply potential in response to the rise of the potential of the control signal $\phi_S$. The potentials of bit lines /BL1 and BL2 are decreased to the ground potential in response to the rise of the potential of the control signal $\phi_S$.

After the control signal $\phi_S$ attains to the high level, the potentials of signal lines CY1 and CY2 are successively set to and maintained for a prescribed time period at a high level, as shown in FIGS. 15(f) and (g).

While the potential of signal line CY1 is at the high level, transistors T1-1 and T2-1 are ON. Therefore, potentials on I/O lines IO and /IO are determined by the potentials on bit lines BL1 and /BL1, respectively.

Similarly, while the potential of signal line CY2 is at the high level, transistors T1-2 and T2-2 are ON, and therefore potentials on I/O lines IO and /IO are determined by the potentials on bit lines BL2 and /BL2.

The potential of control signal /$\phi_W$ is always at the high level during data reading, as shown in FIG. 15(e). The potential of the control signal $\phi_{EQ}$ is maintained at the high level while the potential of any one of the output signal lines of column decoder 57 is at the high level as shown in FIG. 15(h), and accordingly, the potential of the control signal /$\phi_{EQ}$ is maintained at the low level while the potential of any one of the output signal lines of the column decoder 57 is at the high level as shown in FIG. 15(i).

Therefore, in data reading, the transistors T3 and T4 are ON in I/O line equalizer 500, and transistors T5 and T6 are OFF only when one of the output signal lines of column decoder 57 is at the high level.

Therefore, the I/O lines IO and /IO are fixed to the potential (Vcc−Vth) lower than the supply potential by the threshold voltage $V_{TH}$ of transistor T3 or T4, regardless of the output potentials of the sense amplifiers, when the potentials of the output signal lines of column decoder 57 are not at the high level. Therefore, immediately before the potential on signal line CY1 attains to the high level, the potential on the I/O line IO is lower than the potential of bit line BL1 by the threshold voltage Vth mentioned above, and potential of I/O line /IO is higher than the potential of bit line /BL1. Similarly, immediately before the potential of signal line CY2 attains to high level, the potential of I/O line IO is higher than the potential of bit line BL2 and the potential between I/O and IO is lower than the potential of bit line /BL2 by said threshold voltage $V_{TH}$.

Therefore, when the potential of signal line CY1 attains to the high level, the potential on I/O line IO begins to rise to the supply potential because of the charges entering from bit line BL1, while the potential on I/O line /IO begins to lower toward the ground potential because of charges flowing out to bit line /BL1 (see FIG. 15(j)).

When the potential of signal line CY1 returns to the low level, transistors T5 and T6 turn ON in I/O line equalizer 500, and therefore, the potential of I/O line IO begins to lower, while the potential of I/O line /IO begins to rise. Finally, the potentials of I/O lines IO and /IO become equal to each other.

When the potential of signal line CY2 attains to the high level, transistors T5 and T6 are again turned OFF in I/O line equalizer 500. Therefore, because of the charges flowing out from the bit line I/O line IO to the bit line BL2, the potential of I/O line IO begins to lower to the ground potential, while the potential of I/O line /IO begins to rise because of the charges flowing in from bit line /BL2 to I/O line /IO.

When the potential of signal line CY2 returns to the low level, transistors T5 and T6 in I/O line equalizer 500 are again turned on. Therefore, the potentials of I/O lines IO and /IO rises and lowers, respectively, and finally, they are fixed at a potential lower than the supply potential by the respective threshold voltages $V_{TH}$ of transistors T3 and T4.

As shown in FIG. 15(k), control signal $\phi_P$ is kept at high level for a prescribed time period after any one of the output signal lines of column decoder 57 attains high level.

Namely, after the potentials of I/O lines IO and /IO begin to change dependent on the potentials on bit lines BL1 and /BL1 and after the potentials of I/O lines IO and /IO begin to change dependent on the potentials on bit lines BL2 and /BL2, transistor T11 turns ON in the amplifying circuit 510.

Referring to FIG. 13, when transistor T11 turns ON, one of the transistors T9 and T10 turns on dependent on the magnitude of the gate potentials of transistor T9 and T10, and thus supplies a current flowing through transistor T11 to the ground $V_{SS}$.

More specifically, when the gate potential of transistor T9 is higher than the gate potential of transistor T10, transistor T9 turns on and supplies a current whose magnitude corresponds to the difference between these gate potentials to transistor T11. When the gate potential of transistor T10 is higher than the gate potential of transistor T9, transistor T10 turns ON and supplies a current whose magnitude corresponds to the difference between these gate potentials to transistor T11.

When transistor T9 turns on, the potential at node N3 lowers because of the current flowing through transistors T9 and T11 to the ground $V_{SS}$. When the potential of node N3 becomes lower than the threshold voltage $V_{TH}$ of transistor T8, transistor T8 is rendered conductive and therefore, a current flowing from power supply $V_{CC}$ to the node N4 is generated. Meanwhile, since transistor T10 is OFF, the potential of node N4 is at the supply potential.

When transistor T10 is rendered conductive, the potential at node N4 lowers because of the current flowing from node N4 through transistors T10 and T11 to the ground $V_{SS}$. Thus the potential at node N4 attains to a low level.

When control signal $\phi_P$ is at the low level, transistor T11 is OFF. Therefore, regardless of the gate potentials of transistors T9 and T10, potentials at nodes N3 and N4 are approximately at the supply potential.

Therefore, when the control signal $\phi_P$ attains a high level after the potential of signal line CY1 attains high level, the potential $\phi_{OUT}$ of node N4 is kept at the potential (supply potential) at which it has been kept, as shown in FIG. 15(*l*), since the gate potential of transistor T9 (potential of the I/O line IO) is higher than the gate potential (potential of I/O line /IO) of transistor T10. When the potential of the control signal $\phi_P$ attains to high level after the potential of signal line CY2 attains to the high level, the potential $\phi_{OUT}$ of node N4 begins to lower to a low potential as described above and shown in FIG. 15(*l*), since the gate potential of transistor T10 is higher than the gate potential of transistor T9.

Thereafter, when control signal $\phi_P$ returns to the low level, transistor T11 is turned off in the amplifying circuit 510, and thus the potential $\phi_{OUT}$ of node N4 returns to the supply potential.

In this manner, when the potential of the I/O line IO is increasing, the output potential $\phi_{OUT}$ of the amplifying circuit 510 attains to the high level, and when the potential of the I/O line IO is decreasing, it attains to the low level. Namely, when control signal $\phi_P$ is at the high level, the amplifying circuit 510 operates to output a potential whose level corresponds to the data stored in the selected memory cell MC1, MC2.

The length of the period in which the output signal line CY of column decoder 57 is maintained at the high level is set longer than the period from the potential difference between I/O lines IO and /IO begins to start until it reaches the maximum value $V_O$.

As described above, in the conventional semiconductor memory device in which two bit lines are provided corresponding to each column of memory cells and data stored in a memory cell of the column of the memory cell is read utilizing the potential difference between the two bit lines, read data is provided by amplifying, by an amplifier, the potential difference generated between two. I/O lines when two I/O lines are connected to the two bit lines corresponding to the selected column of the memory cells.

Therefore, the earlier the timing of starting operation of the amplifier and the higher the speed of change of the output potential are in the amplifier, the shorter becomes the time from selection of one memory cell by the row decoder and the column decoder to the stabilization of the output potential of the amplifier corresponding to the data stored in the memory cell, that is, the shorter becomes the access time in data reading.

For example, in the DRAM shown in FIGS. 10–15, the earlier becomes the timing of the control signal $\phi_P$ to attain high level, the earlier the amplifying circuit 510 starts its operation. Therefore, the potential $\phi_{OUT}$ of the node N4 in the amplifying circuit 510 begins to change dependent on the potential difference between the I/O lines IO and /IO at an earlier timing.

More specifically, referring to FIG. 15, if the period from the time when potential of I/O line IO attains lower than the potential of I/O line /IO in response to the rise of the potential of control signal $\phi_{EQ}$ after the potential of CY2 attains high level, to the time when the potential of control signal $\phi_P$ attains to the high level, becomes shorter, the output potential $\phi_{out}$ of amplifying circuit 510 lowers more quickly to the potential corresponding to the data stored in memory cell MC2.

In the amplifying circuit 510, after the potential of control signal $\phi_P$ attains to the high level and the speed of change of the potential $\phi_{out}$ at node N4 is high, then the period $\tau_2$ becomes shorter in which period the amplifying circuit 510 starts its operation in response to the potential difference between the I/O lines IO and /IO generated by the control signal $\phi_{EQ}$ attaining high level after the potential of signal line CY2 has attained to the high level, and outputs a low level potential.

The speed of change of the output potential $\phi_{out}$ of the amplifying circuit 510 is also affected by the potential difference between I/O lines IO and /IO at the start of operation of the amplifying circuit 510.

More specifically, referring to FIG. 13, when transistor T11 is turned on with the gate potential of transistor T10 being sufficiently larger than the gate potential of transistor T9, the potential at node N4 quickly lowers to the low level, since a large current flows from node N4 through transistors T10 and T11 to the ground $V_{SS}$. However, when the transistor T11 is turned ON with the gate potential of transistor T10 being slightly higher than the gate potential of transistor T9, the potential at node N4 lowers slowly to the low level, since a small current flows from node N4 through transistors T10 and T11 to the ground $V_{SS}$.

In a conventional DRAM, during a period in which any one of the output signal lines of column decoder is at the high level, the potential difference between two I/O lines is very large. Therefore, the potential difference between the two I/O lines at the start of operation of the current mirror amplifier becomes small. This phenomenon will be described in detail with reference to FIGS. 11 to 13 and 15.

In both periods in which the signal line CY1 is at the high level and the signal line CY2 is at the high level, the potential difference between I/O lines IO and /IO reaches a very large value of the difference voltage $V_O$ between the supply potential and the ground potential, as shown in FIG. 15(*j*). Therefore, when the signal line CY1 attains the low level and then control signal $\phi_{EQ}$ attain the low level, it takes long to exchange charges between I/O lines IO and /IO through transistors T5 and T6. Consequently, the time $\tau_1$ necessary for the potentials of the I/O lines IO and /IO to be equal to each other becomes longer.

In the period when the signal line CY2 is at the high level, the potentials of the I/O lines IO and /IO must be the ground potential and the power supply potential, respectively, in response to the rise of control signal $\phi_{EQ}$, contrary to the period in which the output signal line CY1 of the column decoder 57 is at the high level. However, since the time T1 necessary for the potential difference between I/O lines IO and /IO to reach zero from the fall of the potential of signal line CY1 is long, it takes long for the potential of the IO line IO and of /IO to reach the ground potential and to the power supply potential, respectively, in response to the rise of the control signal $\phi_{EQ}$ after the potential of signal line CY2 attains the high level.

Therefore, at the time when the control signal $\phi_P$ has risen to the high level after the potentials of the signal line CY2 and the control signal $\phi_{EQ}$ have both attained to the high level, the potential difference $\Delta V$ between I/O lines IO and /IO is not large enough but still small. Therefore, in response to the rise of the control signal $\phi_P$ for reading data from memory cell MC2, the output potential $\phi_{out}$ of amplifying circuit 510 does not lower quickly but attains to the low level taking a long period of time T2.

As described above, when the data stored in the first and second memory cells which are read continuously are different from each other, if the time $\tau 1$ necessary for equalizing the potentials of the I/O lines IO and /IO is long, then the potential difference $\Delta V$ between the I/O lines IO and /IO at the start of the operation of the amplifying circuit 510 for reading data from the second memory cell become small, and as a result, it takes long to read data from the second memory cell.

In order to avoid such phenomenon, the timing of rise of the control signal $\phi_P$, that is, the timing of starting the operation of amplifying circuit 510 should be delayed to the time when the potential difference between the I/O lines IO and /IO becomes sufficiently large. By this method, the speed of change of the output potential $\phi_{out}$ of the amplifying circuit 510 is increased. Therefore, the time T2 necessary for the output potential $\phi_{out}$ of the amplifying circuit 510 to reach the potential corresponding to the data stored in the second memory cell from the rise of the control signal $\phi_P$ for reading data from the second memory cell becomes shorter. However, the time from when the potential of signal line CY2 attains to high level to when control signal $\phi_P$ attains to the high level for reading data from the second memory cell becomes longer. Therefore, the access time in data reading cannot be improved by this method.

SUMMARY OF THE INVENTION

An object of the present invention is to provide a semiconductor memory device in which access time in data reading is reduced.

A further object of the present invention is to provide a semiconductor memory device in which potential difference between pair of I/O lines quickly reaches a magnitude corresponding to the data stored in the selected memory cell.

A further object of the present invention is, in a semiconductor memory device in which data stored in a memory cell is read utilizing potential difference generated between two bit lines provided corresponding to the column in which the memory cell is arranged to enlarge potential difference between a pair of I/O lines at the start of operation of an amplifier amplifying the potential difference between the two I/O lines, without providing a delay in the timing for starting the operation of the amplifier.

A still further object of the present invention is, in a semiconductor memory device in which data stored in a memory cell is read utilizing a potential difference generated between two bit lines provided corresponding to the column in which the memory cell in arranged, to reduce the time period from the time of electrical connection of these two bit lines to a pair of I/O lines to the start of operation of an amplifier amplifying the potential difference between the two I/O lines, in data reading.

A still further object of the present invention is, in a semiconductor memory device in which data stored in a memory cell is read by utilizing a potential difference generated between two bit lines provided corresponding to the column in which the memory cell is arranged, to increase speed of change of the output potential from an amplifier, after the start of amplifying the potential difference between a pair of I/O lines by the amplifier.

In accordance with one aspect, the semiconductor memory device of the present invention includes a plurality of memory cells arranged in a plurality of columns and a plurality of rows, a row selecting circuit for selecting one of the plurality of rows, a column selecting circuit for selecting one of the plurality of columns, a plurality of bit line pairs provided corresponding to the plurality of columns, and first and second data lines for exchanging data with the outside. Each of the plurality of bit lines include first and second bit lines.

The semiconductor memory device further includes a circuit for forcing, corresponding to data of each memory cell of the selected row selected by the row selecting circuit during data reading, corresponding first and second bit lines to complementary potentials, a connecting circuit for connecting electrically the corresponding first and second bit lines to the first and second data lines for a prescribed time period after the enforcement by the forcing circuit, an equalizing circuit for equalizing the first and second data lines at an equal potential until the corresponding first and second bit lines are connected to the first and second data lines by the connecting circuit, an amplifier for amplifying, after the aforementioned prescribed time period from the connection of the corresponding first and second bit lines to the first and second data lines by the connecting circuit, the potential difference between the first and second data lines and for externally outputting a voltage the level of which corresponds to the data stored in the selected memory cell.

In order to attain the above described objects, the semiconductor memory device includes, in addition to the above described structure, a control circuit for controlling the potential difference between the first and second data lines such that the difference is within a prescribed value while the corresponding first and second bit lines are connected to the first and second data lines by the connecting circuit. Preferably, the prescribed value is smaller than the difference between the supply potential and the ground potential.

Since the semiconductor memory device of the present invention is structured as described above, in data reading, the first and second bit lines forced to complementary potentials corresponding to the data stored in the selected memory cell are connected to the first and second data lines by the connecting circuit, respectively, and the maximum value of the potential difference generated by the first and second data lines is controlled within a prescribed value. Therefore, the potential difference between the first and second data lines, caused by the change of the potential of the first data line corresponding to the potential of the first bit line electrically connected thereto, and the change of the potential of the second data line corresponding to the potential of the second bit line electrically connected thereto is not enlarged but to a prescribed magnitude which is not influenced by the potentials of the first and second bit lines.

Consequently, the time necessary for the equalizing circuit for equalizing the first and second data lines after the first and second bit lines are kept connected to the first and second data lines for the above mentioned prescribed time period by the connecting circuit, can be arbitrarily adjusted by adjusting the set value of the prescribed magnitude, not adjusting the potential difference between the first and second bit lines corresponding to the selected memory cell.

In accordance with another aspect, the present invention relates to a method of operating a semiconductor memory device including a plurality of memory cells each storing data arranged in a plurality of rows and a plurality of columns, a row selecting circuit for selecting one of the plurality of rows, a column selecting circuit for selecting one of the plurality of columns, first and second data lines for exchanging data with the outside, and a plurality of bit line pairs each including first and second bit lines provided corresponding to the plurality of columns. The operating method includes the steps of forcing the first and second bit lines to complementary potentials corresponding to data stored in each of the memory cells of the row selected by the row selecting circuit in data reading, after the enforcement, electrically connecting the first and second bit lines corresponding to the column selected by the column selecting circuit to the first and second data lines for a prescribed time period, setting the first and second data lines to an equal potential until the corresponding first and second bit lines are electrically connected to the first and second data lines, controlling the potentials of the first and second data lines such that the potential difference between the two data lines is within a prescribed value, while the corresponding first and second bit lines are electrically connected to the first and second data lines, and amplifying a potential difference between the first and second data lines after the lapse of the prescribed time period from electrical connection of the corresponding first and second bit lines to the first and second data lines so as to generate a voltage the level of which corresponding to the data stored in each of the memory cells of the selected row.

Preferably, the prescribed value is smaller than the difference between the supply potential and the ground potential.

According to the operation method, while the first and second bit lines corresponding to the selected column are electrically connected to the first and second data lines, respectively, the potential difference between the first and second data lines does not exceed a predetermined magnitude in data reading. Therefore, the voltage representing the data stored in the selected memory cell is generated by amplifying the potential difference between the first and second data lines which is limited.

As described above, according to the present invention, the potential difference between the two data lines provided for reading data is controlled within a smaller value than in the prior art, and therefore time necessary for equalizing the two data lines can be reduced. Consequently, access time in data reading can be much improved.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 3(a) to 3(c) are schematic diagrams showing examples of a switch circuit 81 of FIG. 2.

FIGS. 4(a) to 4(c) are schematic diagrams showing examples of detecting circuits 80, 82 of FIG. 2.

FIG. 5 is a schematic diagram showing an example of the potential difference control circuit shown in FIGS. 1 and 2.

DESCRIPTION OF THE PREFERRED EMBODIMENTS

Figure 1:
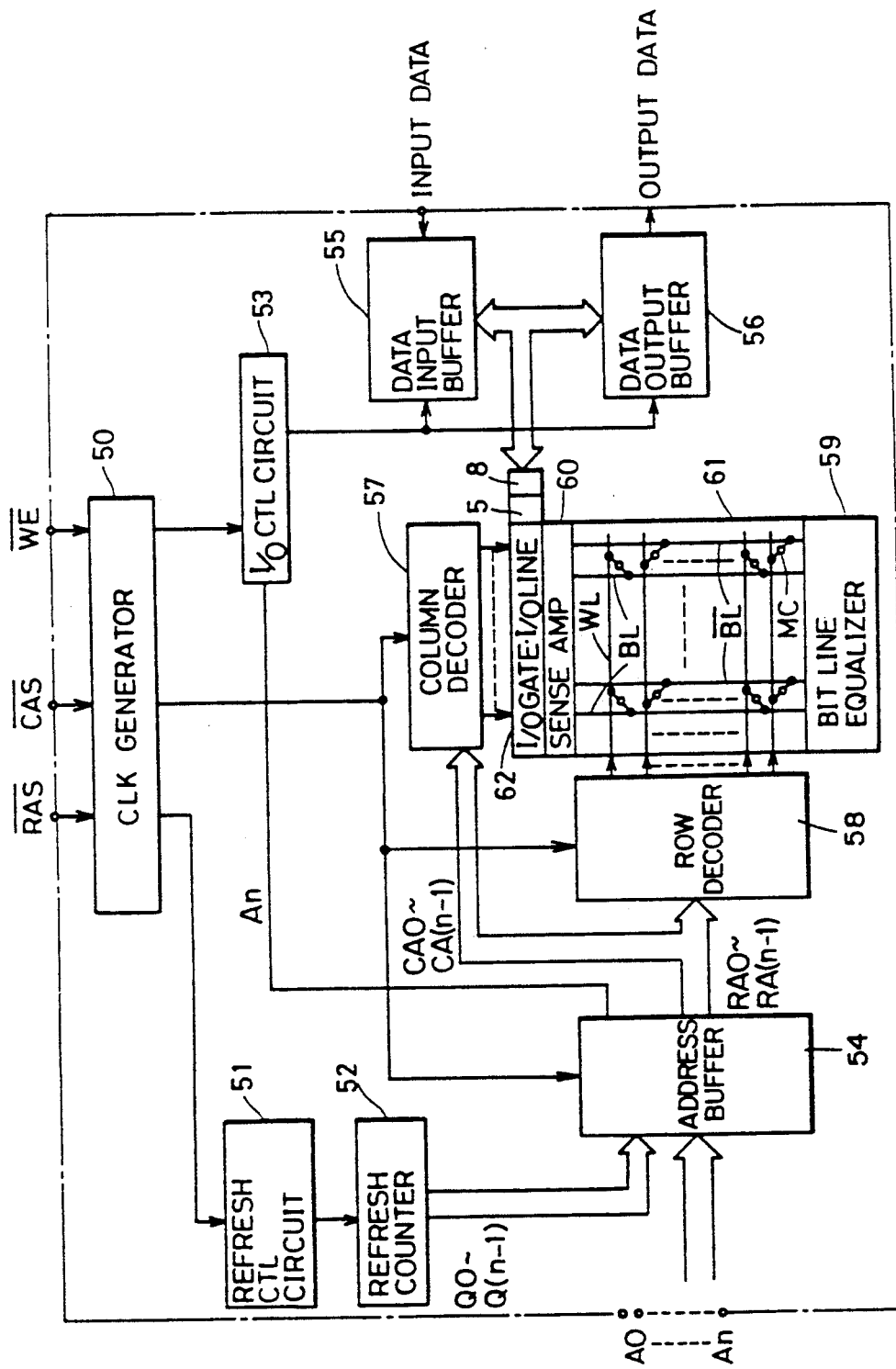
FIG. 1 is a schematic block diagram showing a whole structure of a DRAM in accordance with one embodiment of the present invention.

FIG. 1 is a schematic block diagram showing the whole structure of the DRAM in accordance with one embodiment of the present invention.

Figure 10:
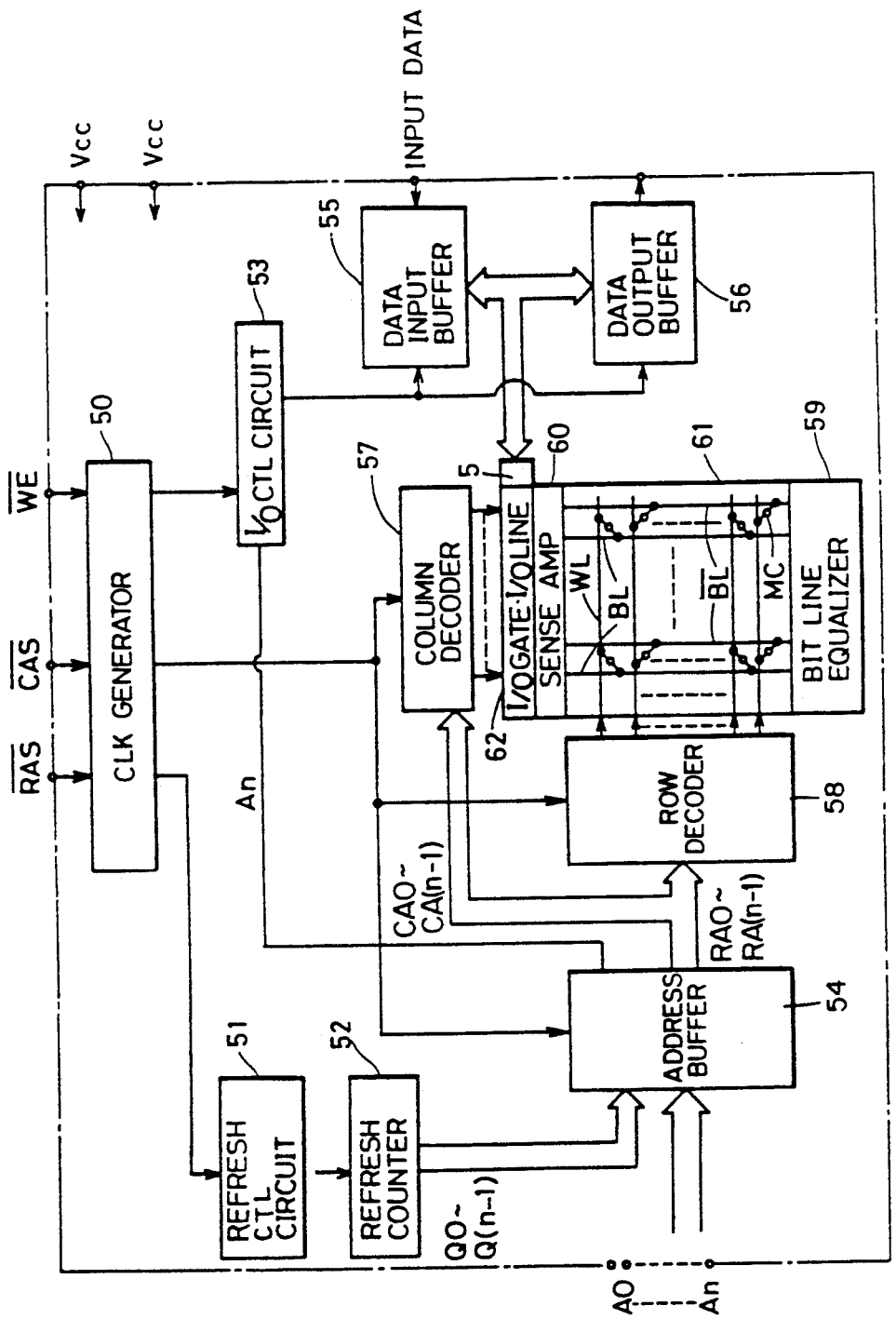
FIG. 10 is a schematic block diagram showing a whole structure of a conventional DRAM.
Figure 11:
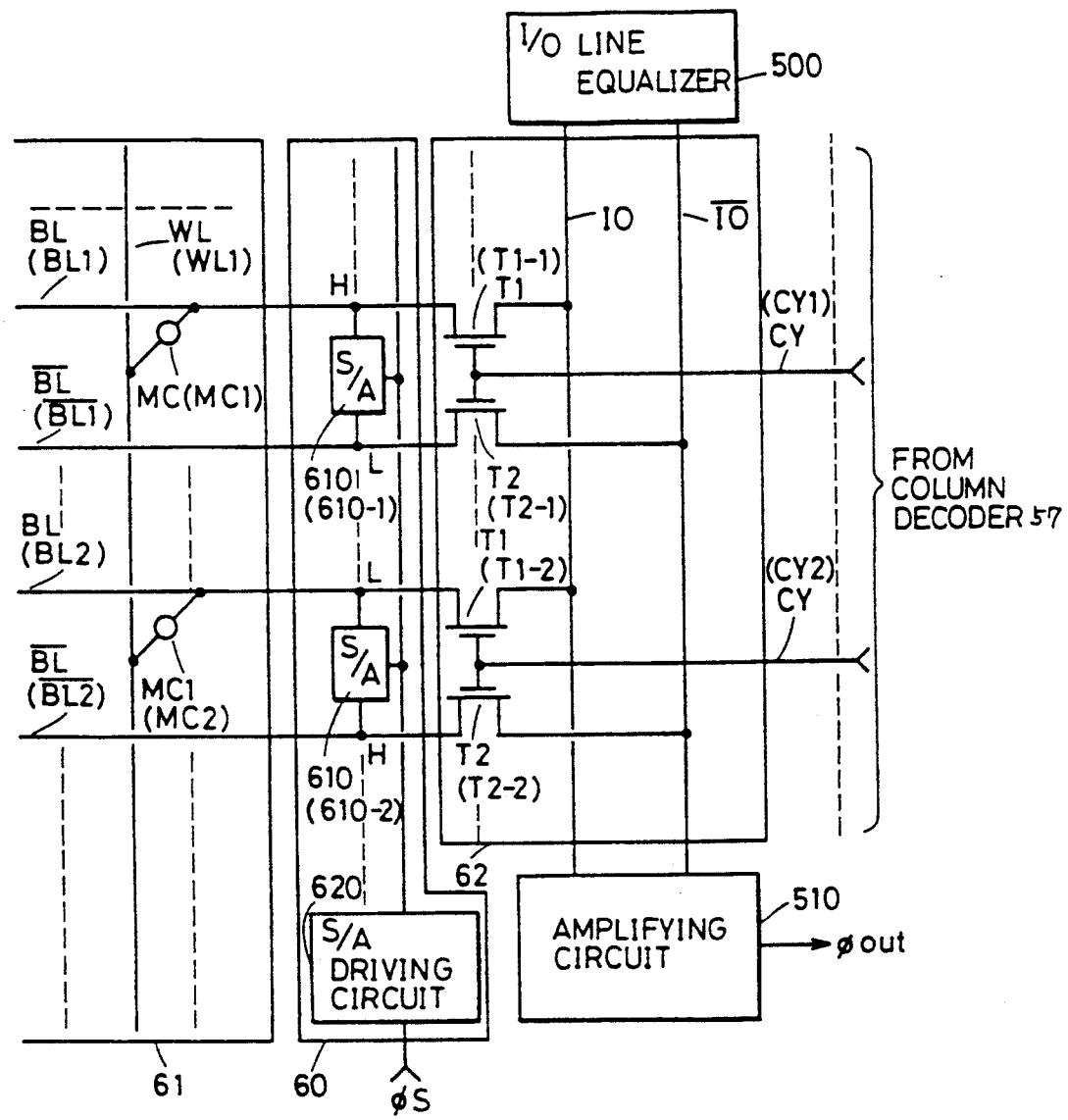
FIG. 11 is a block diagram showing structures of the sense amplifier group 60, I/O line potential control circuit and I/O gate.I/O line of FIG. 10.
Figure 12:
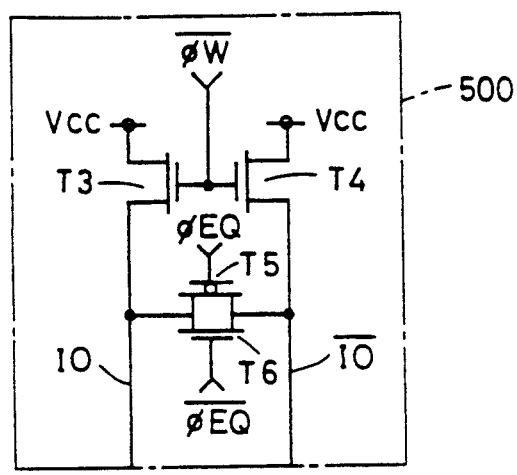
FIG. 12 is a schematic diagram showing a structure of the I/O equalizer shown in FIG. 11.
Figure 13:
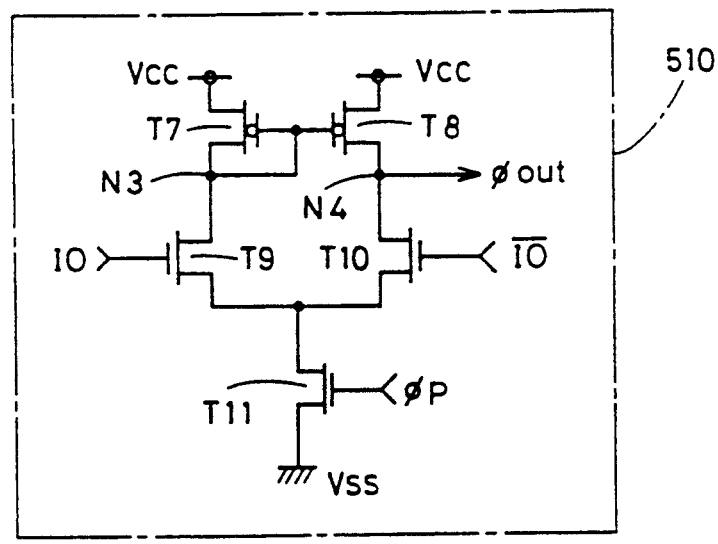
FIG. 13 is a circuit diagram showing a structure of the amplifying circuit of FIG. 11.
Figure 14:
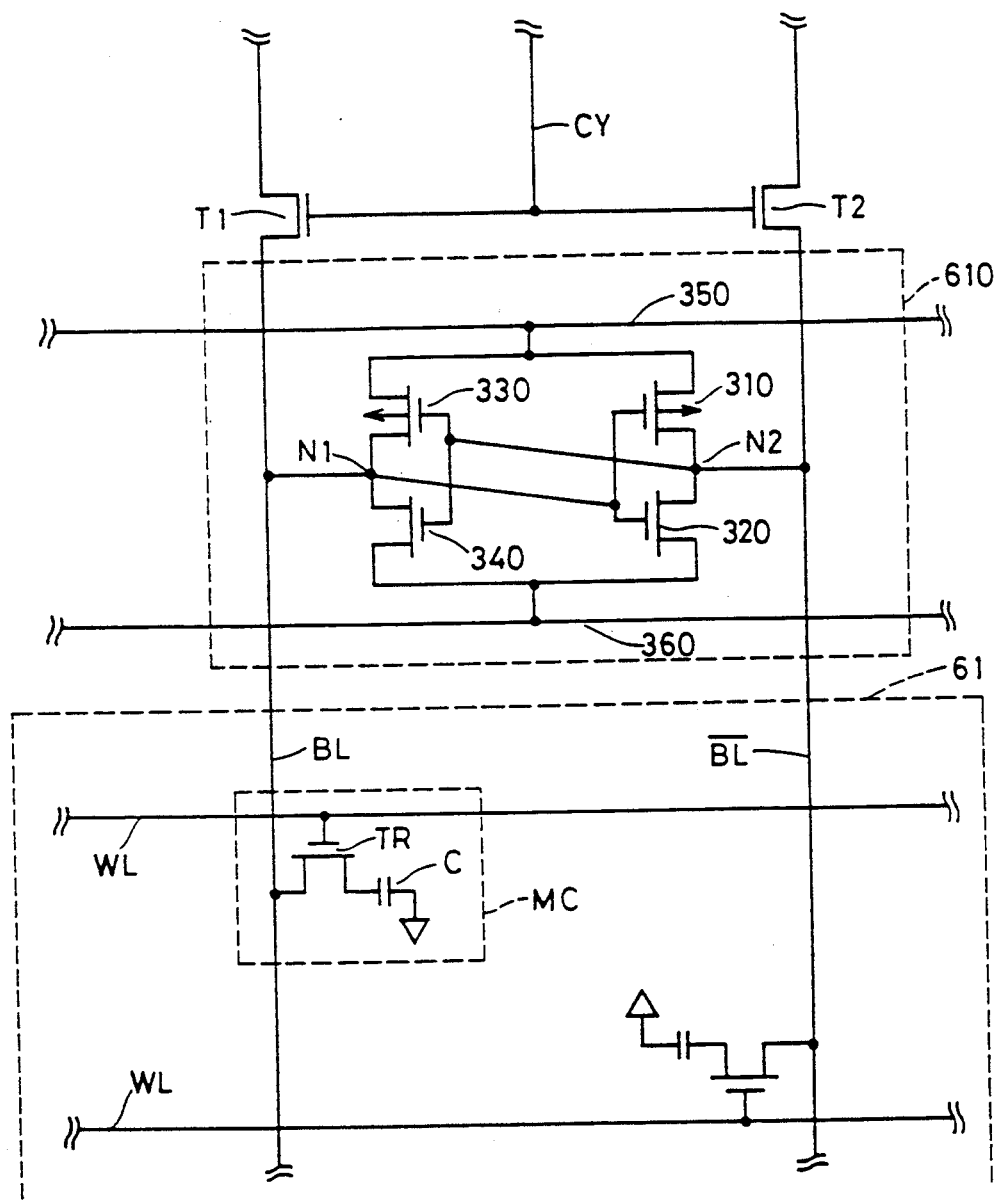
FIG. 14 is a schematic diagram showing structures of a sense amplifier and a memory cell of the DRAM.

Referring to FIG. 1, different from the conventional DRAM shown in FIG. 10, the DRAM includes a potential difference control circuit 8 connected to I/O gate·I/O line 62. Structures of other portions of the DRAM and the operation thereof are the same as those of the conventional example shown in FIG. 10. Therefore, the description is not repeated.

Figure 2:
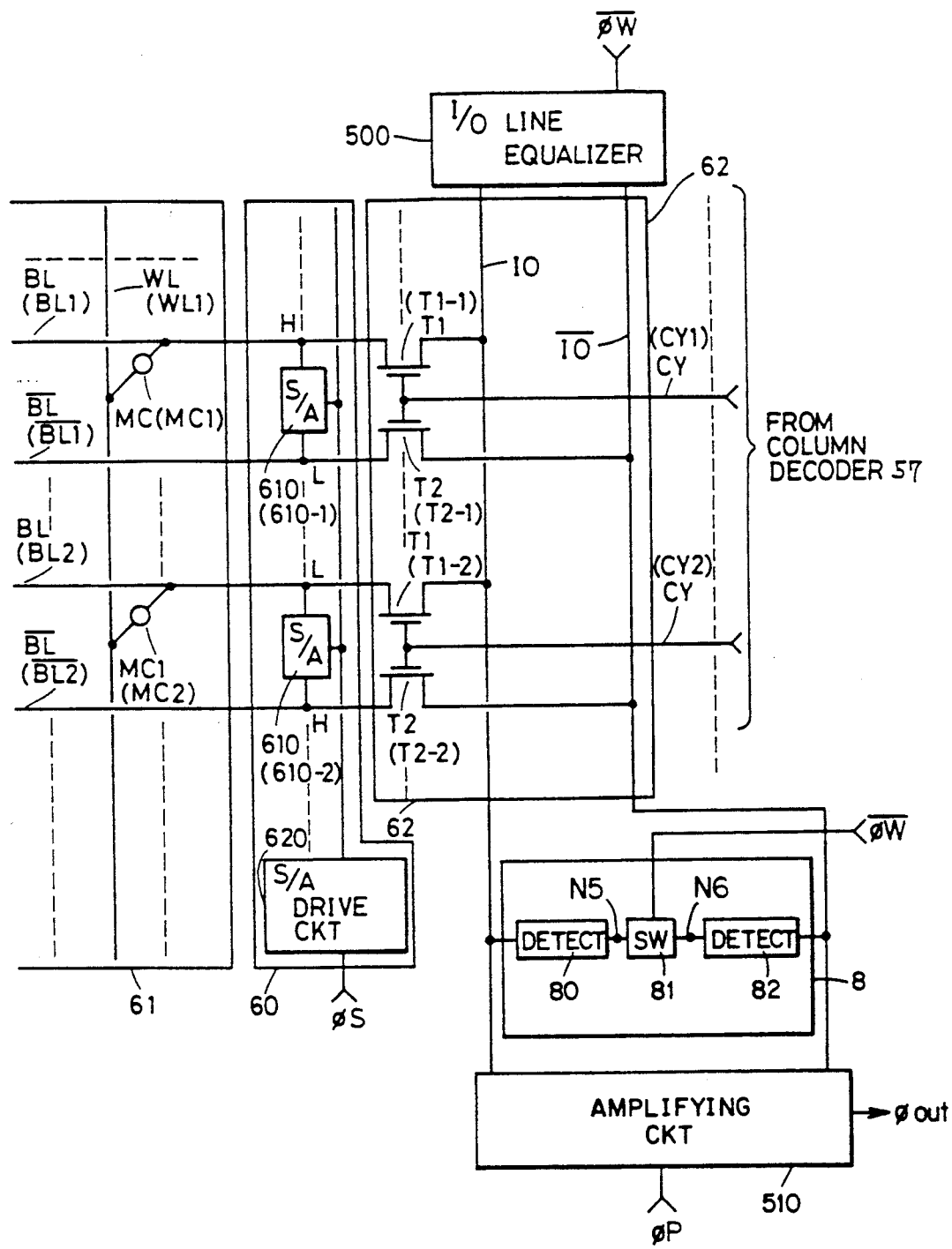
FIG. 2 is a block diagram showing structures of a sense amplifier group 60, I/O gate·I/O line 62, an I/O line potential control circuit 5, and a potential difference control circuit 8.

FIG. 2 is a schematic diagram showing structures of the sense amplifier group 60, I/O gate·I/O line 62 and potential difference control circuit 8 of FIG. 1. A portion provided corresponding to two arbitrary columns of memory cells in the memory cell array 61 is shown in FIG. 2 as a representative.

Potential difference control circuit 8 is connected between I/O lines IO and /IO, and includes two detecting circuits 80 and 82, and a switching circuit 81.

Switch circuit 81 electrically connects a node N5 and a node N6 only when data is to be read from memory cell array 61.

While the switch circuit 80 electrically connects the nodes N5 and N6, detecting circuit 80 electrically connects the I/O line IO to node N5 when the potential difference between the I/O line IO and the node N5 exceeds a prescribed magnitude.

Similarly, while the switch circuit 81 is electrically connecting the nodes N5 and N6, detecting circuit 80 operates to electrically connect the I/O line /IO to node N6, when the potential difference between the I/O line /IO and node N6 reaches or exceeds a prescribed magnitude.

FIGS. 3(a) to 3(c) are schematic diagrams showing examples of the switch circuit 81.

Switch circuit 81 includes, for example, an N channel MOS transistor T12 connected between nodes N5 and N6 and receiving a signal /$\phi_W$ controlling the I/O line equalizer 500, as shown in FIG. 3(a).

The switch circuit 81 may be a P channel MOS transistor T13 connected between nodes N5 and N6 and receiving at its gate a control signal $\phi_W$ provided by inverting the signal /$\phi_W$ controlling the I/O line equalizer 500, as shown in FIG. 3(b).

Further, the switch circuit 81 may be formed by an N channel MOS transistor T14 connected between nodes N5 and N6 and receiving at its gate the control signal /$\phi_W$ and a P channel MOS transistor T15 connected between nodes N5 and N6 and receiving at its gate a signal $\phi_W$ provided by inverting the control signal as shown in FIG. 3(c).

Control signal /$\phi_W$ attains low level when data is to be written to the memory cell array 61, and it attains to high level when data is to be read from the memory cell array 61. Therefore, transistors T12 to T15 provided between nodes N5 and N6 are rendered conductive to electrically connect the nodes N5 and N6 only when the data is to be read, no matter which one of the circuit shown in FIG. 3 is used as the switch circuit 81.

FIG. 4 shows specific examples of the detecting circuits 80 and 82.

Detecting circuit 80 includes two N channel MOS transistors T16 and T17 connected parallel to each other between the I/O line IO and the node N5, as shown in FIG. 4(a), for example. Transistor T16 has its gate connected to node N5, and transistor T17 has its gate connected to I/O line IO.

Detecting circuit 80 may be formed by N channel MOS transistor T18 and an P channel MOS transistor T19 connected parallel to each other between the I/O line IO and N5, as shown in FIG. 4(b). Gates of transistors T18 and T19 are connected to the I/O line IO.

The detecting circuit 80 may be formed by two P channel MOS transistors T20 and T21 connected parallel to each other between the I/O line IO and node N5, as shown in FIG. 4(c). Transistor T20 has its gate connected to node N5, while transistor T21 has its gate connected to I/O line IO.

Detecting circuit 82 may have the similar structure as the detecting circuit 80. When any of the circuits shown in FIGS. 4(a), (b) and (c) is used as the detecting circuit 82, the node N5 and I/O line IO are replaced by node N6 and I/O line /IO, respectively.

In this manner, a circuit in which two MOS transistors each being diode-connected in parallel to each other is used as the detecting circuit 80 or 82. While the nodes N5 and N6 are electrically connected by switching circuit 81, it is possible to make smaller the maximum value of the potential difference between the I/O lines IO and /IO.

FIG. 5 shows a structure of a potential difference control circuit 8 when the circuit of FIG. 3(a) is used as the switch circuit 81, and the circuit of FIG. 4(a) is used for each of the detecting circuits 80 and 82.

The circuit operation at data reading in the DRAM when the circuit such as shown in FIG. 5 is used as the potential difference control circuit 8 will be described with reference to FIGS. 1, 2, 5 to 8. In the following description, the characters shown in parenthesis ( ) in FIG. 2 are used as the reference characters representing the bit lines, word lines, sense amplifiers, transistors constituting the I/O gate, and output signal lines of column decoder 57.

Figure 8:
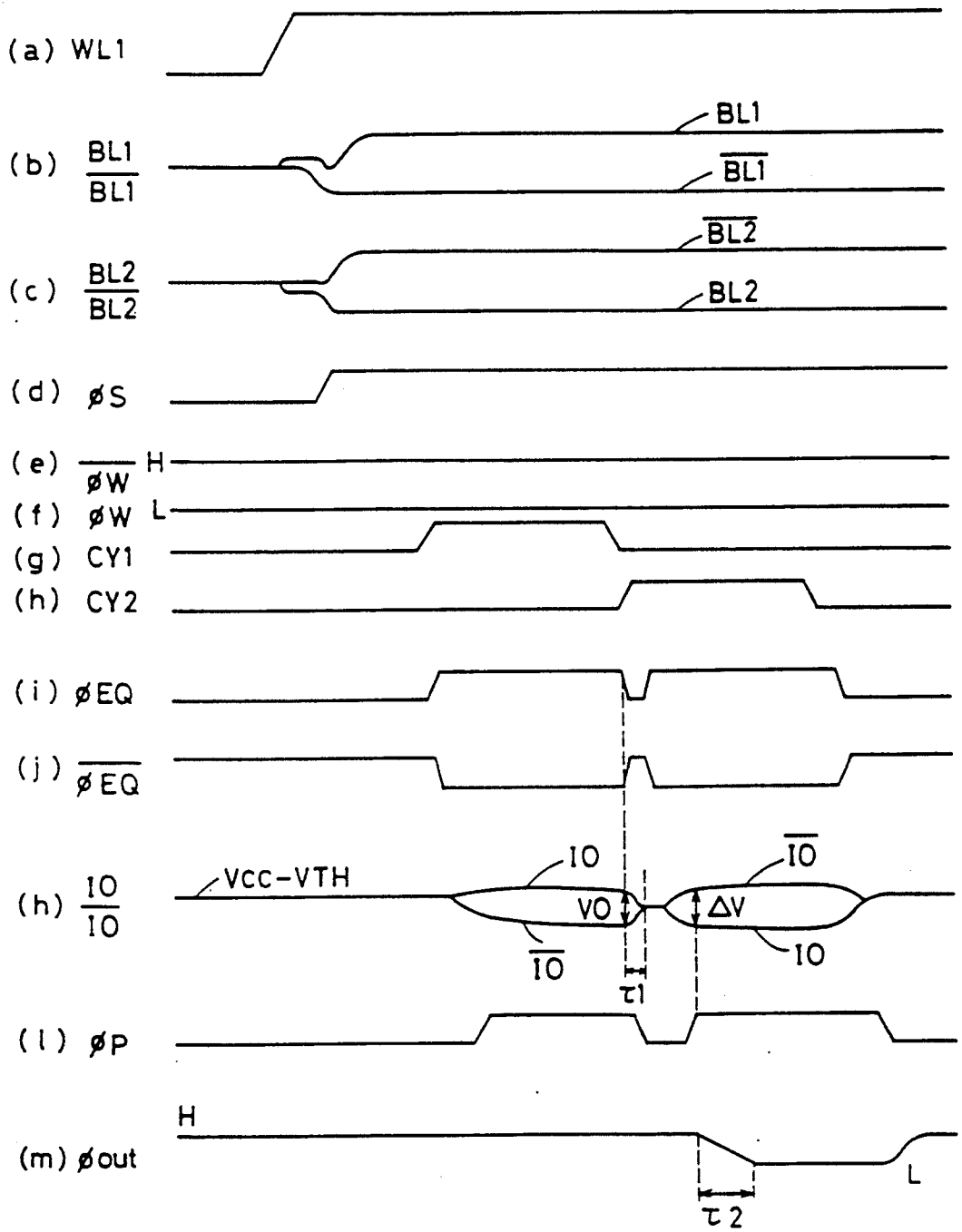
FIGS. 8(a) to 8(m) comprise a timing for describing the circuit operation in data reading of the DRAM in accordance with the embodiment of the present invention.

FIG. 8 is a timing chart showing circuit operation when data are successively read from memory cells MC1 and MC2 of FIG. 2.

Figure 6:
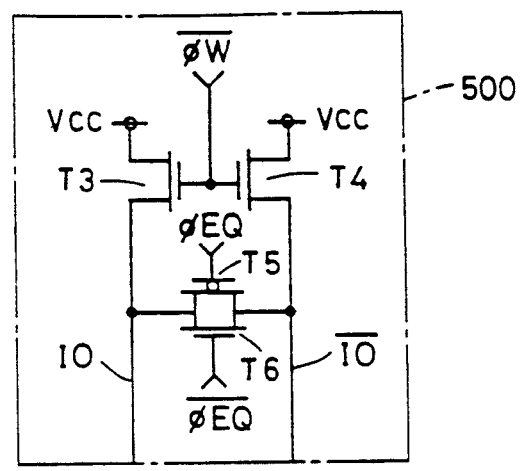
FIG. 6 is a schematic diagram showing a structure of an I/O line equalizer of FIG. 2.

FIG. 6 is a schematic diagram showing a structure of the I/O line equalizer 500 of FIG. 2.

Figure 7:
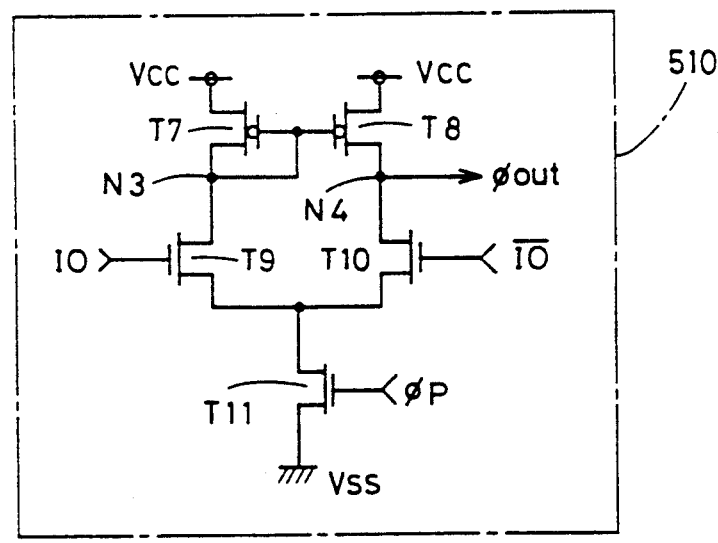
FIG. 7 is a schematic diagram showing a structure of an amplifying circuit of FIG. 2.

FIG. 7 is a schematic diagram showing a structure of the amplifying circuit 510 of FIG. 2.

The potentials of control signals $\phi_S$, /$\phi_W$, $\phi_W$, $\phi_{EQ}$, /$\phi_{EQ}$ and $\phi_P$ are changed in the same timing as in the conventional DRAM by means of a clock generator 50 of FIG. 1 (see FIG. 8(d), (e), (f), (i), (j), (l)). The potential of the word line WL and the potentials of signal lines CY1 and CY2 are respectively raised in the same timing as in the conventional example by means of the row decoder 58 and the column decoder 57 of FIG. 1 (see FIG. 8(a), (g), (h)).

Thus, when data is to be read from memory cell array 61, transistor T24 of FIG. 5 is always ON. Therefore, two N channel MOS transistors T22 and T25 having their gates connected to the /IO side of the I/O line are connected in series with each other and two N channel MOS transistors T23 and T26 having their gates connected to the IO side of the I/O lines are connected in series with each other, between the I/O lines IO and /IO. Therefore, transistors T22 and T25 are not both turned ON and transistors T23 and T26 are not both turned ON, unless the potential of the I/O line /IO attain higher than the potential of the I/O line IO by the sum of the threshold voltages of the two N channel MOS transistors ($2 \times V_{TH}$) or the potential of the I/O line IO attains higher than the potential of the I/O line /IO by the sum of the threshold voltages of the two N channel MOS transistors ($2 \times V_{TH}$). Therefore, the I/O lines IO and /IO are electrically isolated from each other.

Therefore, in the period in which the potentials of signal lines CY1 and CY2 are both at the low level, the I/O lines IO and /IO are equalized by the I/O line equalizer 500, and thus transistors T22, T23, T25 and T26 are all OFF.

Therefore, potentials of respective bit lines and respective I/O lines exhibit the same waveforms as in the prior art in the period from when one word line in the memory cell array 61 attains to high level to the time when one of the output signal lines of column decoder 57 attains high level whereby the I/O lines are electrically connected to one bit line pair.

Figure 15:
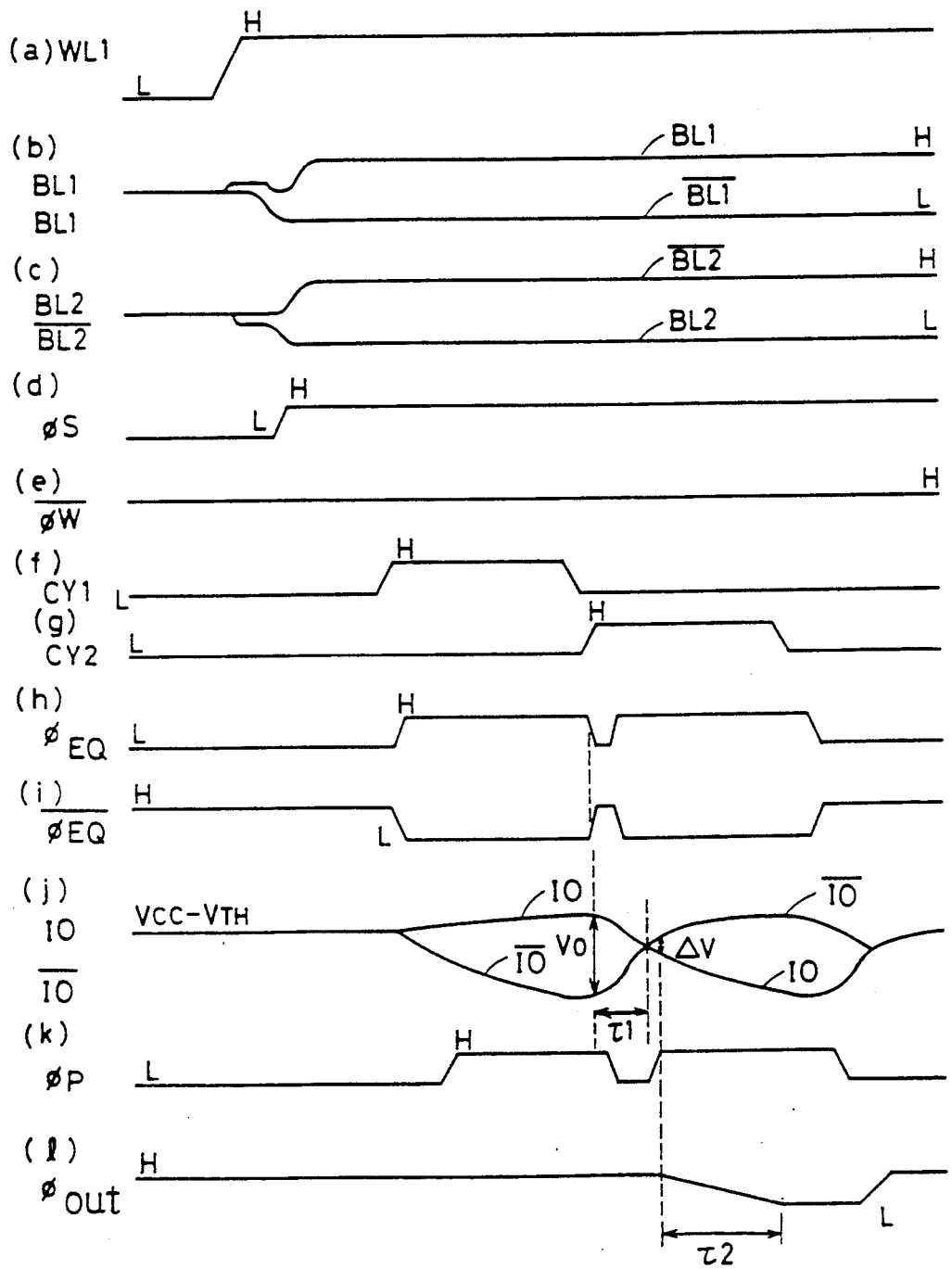
FIGS. 15(a) to 15(l) comprise a timing chart for describing the operation in data writing of the DRAM shown in FIG. 10.

Assume that the data stored in memory cells MC1 and MC2 have the logic values of "1" and "0", respectively the potentials on the bit lines BL1 and /BL1 and BL2 and /BL2 (see FIGS. 8(b) and 8(c) change in the same manner as shown in FIGS. 15(b) and (c) in response to the rise of the potential of the word line WL1. The potentials of the I/O lines IO and /IO are fixed at a potential ($V_{CC} - V_{TH}$) lower than the supply potential by the threshold voltage $V_{TH}$ of each of the transistors T3 and T4 until the control signal $\phi_{EQ}$ attains the high level.

However, the change of potentials on the I/O lines IO and /IO in the period when the potential of the signal line CY1 is at the high level and in the period when the potential of the signal line CY2 is at the high level are different from the prior art.

When the signal CY1 attains high level, the potential of the I/O line IO rises to the supply potential, while the potential of the I/O line /IO lowers to the ground potential. However, as a result of the change of the potentials of the I/O lines IO and /IO, when the potential difference between the I/O lines IO and /IO reaches the sum $(2 \times V_{TH})$ of the threshold voltages of the two N channel MOS transistors, transistors T23 and T26 of FIG. 5 are rendered conductive. Consequently, the I/O lines IO and /IO are electrically connected to each other. The potential of the I/O line IO lowers because of the charges flowing out from the I/O line IO to /IO, while the potential of the I/O line /IO rises because of the charges supplied from the I/O line IO to the I/O line /IO.

When the potential difference between the I/O lines IO and /IO becomes smaller than the sum $(2 \times V_{TH})$ of the threshold voltages, transistors T23 and T26 of FIG. 5 turn OFF. Consequently, the potentials of the I/O lines IO and /IO rises and lowers because of the potentials of the bit lines BL1 and /BL1, respectively. Thus the potential difference between the I/O lines IO and /IO again reaches the sum $(2 \times V_{TH})$ of the threshold voltages. Consequently, transistors T23 and T26 turn ON again.

As a result, the potential difference between the I/O lines IO and /IO is maintained at the sum $(2 \times V_{TH})$ of the threshold voltages until the transistors T5 and T6 are turned ON in the I/O line equalizer 500, once the potential difference reaches the sum $(2 \times V_{TH})$.

When control signal $\phi_{EQ}$ attain low level, transistors T5 and T6 turn ON in the I/O line equalizer 500. Therefore, the potentials of the I/O lines IO and /IO lowers and rises, respectively, so that the potential difference between the I/O lines IO and /IO reaches 0V. However, different from the prior art, the potential difference $V_0$ between the I/O lines IO and /IO at the time point when the control signal $\phi_{EQ}$ attains to the low level is sufficiently smaller than in the prior art, that is, the sum of the threshold voltages $(2 \times V_{TH})$. Therefore, the time T1 necessary for the potential difference between the I/O lines IO and /IO to reach 0V from when the control signal $\phi_{EQ}$ attains to the low level is significantly reduced as compared with the prior art.

Consequently, at the rise of the control signal $\phi_{EQ}$ after the potential of the signal line CY2 attains to the high level, the potential difference between the I/O lines IO and /IO has completely reached 0V. Thus, in response to the rise of the control signal $\phi_{EQ}$, the potential of the I/O line IO immediately lowers because of the low level potential of the bit line BL2, while the potential of the I/O line /IO immediately rises because of the high level potential of the bit line /BL 2.

Consequently, at the rise of the control signal $\phi_P$ after the rise of the potential of the signal line CY2, that is, at the start of operation of the amplifying circuit 510 for taking out the data stored in the memory cell MC2, the potential difference $\Delta V$ between the I/O lines IO and /IO is considerably larger than in the prior art. Therefore, in response to the rise of the controlled signal $\phi_P$ after the rise of the signal line CY2, the output potential $\phi_{out}$ of the amplifying circuit 510 (FIG. 8(m)) lowers to the low level faster than in the prior art. Thus, the time T2 necessary for the output potential $\phi_{out}$ of the amplifying circuit 510 to reach the potential corresponding to the data stored in the memory cell MC2 from the start of operation of the amplifying circuit 510 is reduced as compared with the prior art.

As described above, according to the present embodiment, the maximum value of the potential difference between the I/O lines IO and /IO when data is to be read from each memory cell is controlled to a value very much smaller than the prior art, that is, the sum of the threshold voltages of the two N channel MOS transistors. Consequently, the time necessary for equalizing the potentials of the I/O lines IO and /IO after the appearance of the data stored in one memory cell to the I/O lines IO and /IO can be very much reduced. Therefore, even if data are continuously read from the first and second memory cells storing different data, the data can be read in a short period of time from the second memory cell. Namely, access time in data reading can be improved.

When the data stored in the memory cells MC1 and MC2 are opposite to the above example, then the potential changes of the I/O lines IO and /IO coincide with the potential change of the I/O lines /IO and IO in FIG. 8(k), respectively. In that case, when the control signal $\phi_{EQ}$ attains high level after the signal line CY1 attains to the high level, I/O lines IO and /IO lowers and rises, respectively. Therefore, transistors T23 and T26 of FIG. 5 operate to control the potential difference between the I/O lines IO and /IO such that the potential difference becomes the sum $(2 \times V_{TH})$ of the threshold voltages. More specifically, when the potential of the I/O line IO reaches higher than the potential of the I/O line /IO by the sum $(2 \times V_{TH})$ of the threshold voltages, transistors T23 and T26 are rendered conductive, so as not to enlarge the potential difference between the I/O lines IO and /IO anymore.

In data reading, the control signal $/\phi_W$ attains to the low level, and therefore transistors constituting the switching circuit 81 are all turned OFF. The potentials of the I/O lines IO and /IO are determined only by the I/O line equalizer 500 and external write data signal. Therefore, the data writing operation of the DRAM is carried out in the same manner as in the prior art.

Although parallel connected circuit of two MOS transistors is used as each of the detecting circuits 80 and 82 in the potential difference control circuit 8 in the above description, a circuit having a plurality of such parallel connected circuits connected in series may be used.

Figure 9:
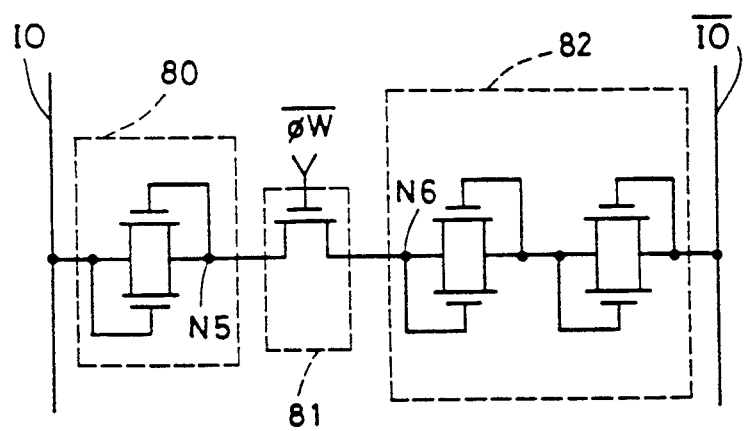
FIG. 9 is a schematic diagram showing another example of the potential difference control circuit shown in FIGS. 1 and 2.

FIG. 9 is a schematic diagram showing the structure of the potential difference control circuit 8 in such a case. Referring to FIG. 9, the potential difference control circuit includes such a circuit as shown in FIG. 3(a) such a circuit as shown in FIG. 4(a) and two such circuits as shown in FIG. 4(a) connected in series, as the switching circuit 81 and the detecting circuits 80 and 82, respectively. In that case, the maximum value of the potential difference between the I/O lines IO and /IO is controlled to be the sum $(3 \times V_{TH})$ of the threshold voltages of the three N channel MOS transistors.

As to the value of the maximum value of the potential difference between the I/O lines IO and /IO during data reading, controlled by the potential difference control circuit 8, the value may be about the minimum value of the potential difference between the gate potential of transistor T9 and the gate potential of transistor T10, at which the potential of node N4 can be changed at high speed in response to the turning ON of the transistor T11 in the amplifying circuit 510.

Although the potential difference control circuit 8 includes a switching circuit 81, the potential difference control circuit 8 does not need the switching circuit 81 when the present invention is applied to a semiconductor memory device in which I/O line for transferring data signals in data reading is provided separate from the I/O line for transferring data signals in data writing.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a plurality of memory cells each storing data, arranged in a plurality of columns and a plurality of rows;
   row selecting means for selecting one of said plurality of rows;
   column selecting means for selecting one of said plurality of columns;
   first and second data lines for externally inputting and outputting data to said semiconductor memory device;
   a plurality of bit line pairs provided corresponding to said plurality of columns, each including first and second bit lines;
   means responsive to data stored in each memory cell of the row selected by said row selecting means at data reading for driving corresponding ones of said first and second bit lines to complementary potentials;
   connecting means for electrically connecting, after said means for driving drives said first and second bit lines to complementary potentials, the first and second bit lines corresponding to the column selected by said column selecting means to said first and second data lines for a prescribed time period, respectively;
   equalizing means for setting said first data line and said second data line to equal potential until said corresponding first and second bit lines are electrically connected to said first and second data lines by said connecting means;
   control means for controlling difference between potentials of said first data line and said second data line while said corresponding first and second bit lines are electrically connected to said first and second data lines respectively, by said connecting means such that the difference is within a prescribed value; and
   amplifying means for amplifying, after said prescribed time period from electrical connection of said corresponding first and second bit lines to said first and second data lines by said connecting means, potential difference between said first data line and said second data line so as to output a voltage the level of which corresponds to the data stored in each memory cell of the selected row.

2. The semiconductor memory device according to claim 1, wherein
   said control means includes electric path means which is rendered conductive in response to the potential difference between said first and second data lines reaching said prescribed value.

3. The semiconductor memory device according to claim 2, wherein
   said first and second data lines are driven to complementary potentials in response to an external data at data writing; and
   said electric path means includes
   first switching means which turns on in response to a change of the potential of said first data line by a first prescribed amount,
   second switching means which turns on in response to a change of the potential of said second data line by a second prescribed amount, and
   third switching means provided between said first switching means and said second switching means, controlled such that it turns on at said data reading and it turns off at said data writing.

4. The semiconductor memory device according to claim 3, wherein
   said first switching means includes
   a first field effect semiconductor element having a first conduction terminal connected to said first data line, and a second conduction terminal and a control terminal connected to said third switching means, and
   a second field effect semiconductor element having a first conduction terminal and a control terminal connected to said first data line, and a second conduction terminal connected to said third switching means,
   said first field effect semiconductor element being the same conductivity type as that of said second field effect semiconductor element.

5. The semiconductor memory device according to claim 3, wherein
   said first switching means includes
   a first field effect semiconductor element having a first conduction terminal and a control terminal connected to said first data line and a second conduction terminal connected to said third switching means, and
   a second field effect semiconductor element having a first conduction terminal and a control terminal connected to said first data line and a second conduction terminal connected to said third switching means,
   said first field effect semiconductor element being the complementary conductivity type as that of said second field effect semiconductor element.

6. The semiconductor memory device according to claim 4, wherein
   said second switching means includes
   a third field effect semiconductor element having a first conduction terminal connected to said second data line, and a second conduction terminal and a control terminal connected to said third switching means, and
   a fourth field effect semiconductor element having a first conduction terminal and a control terminal connected to said second data line and a second conduction terminal connected to said third switching means,
   said third field effect semiconductor element being the same conductivity type as that of said fourth field effect semiconductor element.

7. The semiconductor memory device according to claim 5, wherein said second switching means includes
a third field effect semiconductor element having a first conduction terminal connected to said second data line, and a second conduction terminal and a control terminal connected to said third switching means, and
a fourth field effect semiconductor element having a first conduction terminal and a control terminal connected to said second data line and a second conduction terminal connected to said third switching means,
said third field effect semiconductor element being the same conductivity type as that of said fourth field effect semiconductor element.

8. The semiconductor memory device according to claim 4, wherein
said second switching means includes
a third field effect semiconductor element having a first conduction terminal and a control terminal connected to said second data line, and a second conduction terminal connected to said third switching means, and
a fourth field effect semiconductor element having a first conduction terminal and a control terminal connected to said second data line and a second conduction terminal connection to said third switching means,
said third field effect semiconductor element being the complementary conductivity type as that of said fourth field effect semiconductor element.

9. The semiconductor memory device according to claim 5, wherein
said second switching means includes
a third field effect semiconductor element having a first conduction terminal and a control terminal connected to said second data line, and a second conduction terminal connected to said third switching means, and
a fourth field effect semiconductor element having a first conduction terminal and a control terminal connected to said second data line and a second conduction terminal connected to said third switching means,
said third field effect semiconductor element being the complementary conductivity type as that of said fourth field effect semiconductor element.

10. The semiconductor memory device according to claim 3, wherein
said third switching means includes
a fifth field effect semiconductor element having a first conduction terminal connected to said first switching means, a second conduction terminal connected to said second switching means, and a control terminal receiving a prescribed control signal
said prescribed control signal having complementary potentials at said data writing and said data reading.

11. The semiconductor memory device according to claim 2, wherein
said electric path means includes
a plurality of first diode means coupled in series with each other between said first data line and said second data line, and
a plurality of second diode means coupled in anti-parallel to said plurality of first diode means and in series with each other between said first data line and said second data line.

12. The semiconductor memory device according to claim 11, wherein
said prescribed value is an integer multiple of a threshold voltage of the field effect semiconductor element.

13. The semiconductor memory device according to claim 12, wherein
each of said plurality of first diode means includes a first field effect semiconductor element having a first conduction terminal, a second conduction terminal and a control terminal connected to said second conduction terminal, and
each of said plurality of second diode means includes a second field effect semiconductor element having a first conduction terminal, a second conduction terminal and a control terminal connected to said second conduction terminal.

14. The semiconductor memory device according to claim 2, wherein said first and second data lines are driven to complementary potentials corresponding to an external data during data writing; and
said electric path means includes
first diode means connected between said first data line and said second data line, and
second diode means connected in anti-parallel to said first diode means and between said first data line and said second data line.

15. The semiconductor memory device according to claim 14, wherein
said prescribed value is an integer multiple of a threshold voltage of the field effect semiconductor element.

16. The semiconductor memory device according to claim 15, wherein
said first diode means includes a first field effect semiconductor element having a first conduction terminal, and a second conduction terminal and a control terminal connected to said second conduction terminal, and
said second diode means includes a second field effect semiconductor element having a first conduction terminal, and a second conduction terminal and a control terminal connected to said second conduction terminal.

17. The semiconductor memory device according to claim 1, wherein
each of said plurality of memory cells is a dynamic memory cell.

18. The semiconductor memory device according to claim 1, wherein
said prescribed value is smaller than a difference between power supply potential and the ground potential.

19. A method of operating a semiconductor memory device including a plurality of memory cells each storing data arranged in a plurality of columns and a plurality of rows, row selecting means for selecting one of said plurality of rows, column selecting means for selecting one of said plurality of columns, first and second data lines for externally inputting and outputting data to said semiconductor memory device, and a plurality of bit line pairs each including first and second bit lines provided corresponding to said plurality of columns, comprising the steps of:
driving, corresponding to the data stored in each memory cell of the row selected by said row selecting means, corresponding said first and second bit lines to complementary potentials, in data reading;

electrically connecting, after the step of driving, the first and second bit lines corresponding to the column selected by said column selecting means to said first and second data lines for a prescribed time period, respectively;

setting said first data line and said second data line to equal potential until said corresponding first and second bit lines are electrically connected to said first and second data lines respectively;

controlling a difference between the potentials of said first data line and said second data line such that the difference is within a prescribed value, while said corresponding first and second bit lines are electrically connected to said first and second data lines; and after said prescribed time period from electrical connections of said corresponding first and second bit lines to said first and second data lines, amplifying the potential difference between said first data line and said second data line so as to generate a voltage the level of which corresponds to the data stored in each memory cell of said selected row.

20. The method of operating the semiconductor memory device according to claim 19, wherein said prescribed value is smaller than a difference between power supply potential and the ground potential.

* * * * *